(12) United States Patent
Schley et al.

(10) Patent No.: US 11,315,840 B2
(45) Date of Patent: Apr. 26, 2022

(54) ASSEMBLY AND METHOD FOR PERFORMING IN-SITU ENDPOINT DETECTION WHEN BACKSIDE MILLING SILICON BASED DEVICES

(71) Applicant: Battelle Memorial Institute, Columbus, OH (US)

(72) Inventors: Jeremiah J. Schley, Columbus, OH (US); Thomas Kent, Columbus, OH (US); Katie Liszewski, Powell, OH (US); Isaac Goldthwaite, Columbus, OH (US)

(73) Assignee: Battelle Memorial Institute, Columbus, OH (US)

( * ) Notice: Subject to any disclaimer, the term of this patent is extended or adjusted under 35 U.S.C. 154(b) by 20 days.

(21) Appl. No.: 16/881,848

(22) Filed: May 22, 2020

(65) Prior Publication Data

US 2020/0373211 A1 Nov. 26, 2020

Related U.S. Application Data

(60) Provisional application No. 62/851,777, filed on May 23, 2019.

(51) Int. Cl.
| | |
|---|---|
| *H01L 21/66* | (2006.01) |
| *H01L 21/304* | (2006.01) |
| *B23C 3/00* | (2006.01) |
| *H01L 21/67* | (2006.01) |

(52) U.S. Cl.
CPC .............. *H01L 22/26* (2013.01); *B23C 3/007* (2013.01); *H01L 21/3043* (2013.01); *H01L 21/67092* (2013.01); *H01L 21/67253* (2013.01)

(58) Field of Classification Search
CPC ................. B23C 3/007; H01L 21/3043; H01L 21/67092; H01L 21/67253; H01L 22/26
See application file for complete search history.

(56) References Cited

U.S. PATENT DOCUMENTS

| | | | |
|---|---|---|---|
| 6,620,369 B1 | 9/2003 | Mead | |
| 10,054,624 B2 | 8/2018 | House et al. | |
| 10,206,519 B1* | 2/2019 | Gyori | .................... A47F 5/0018 |
| 2018/0307654 A1 | 10/2018 | Liszewski et al. | |
| 2019/0177123 A1* | 6/2019 | Shah | .................... B66B 11/0246 |

\* cited by examiner

*Primary Examiner* — Dung A. Le
(74) *Attorney, Agent, or Firm* — Donald J. Perreault; Grossman, Tucker, Perreault & Pfleger PLLC (57) ABSTRACT

An assembly for monitoring a semiconductor device under test comprising a mill configured to mill the device, a sensor configured to measure an electrical characteristic of the device, and a computer configured to determine the amount of strain in the device from the electrical characteristic when the mill is milling the device and detect an endpoint of milling at a circuit within the device. In use the endpoints of the milling process of the semiconductor device are detected measuring an electrical characteristic of the device with a sensor during milling determining the amount of strain in the device from the electrical characteristic and detecting an endpoint of the milling process within the device based on the amount of strain.

19 Claims, 11 Drawing Sheets

ASSEMBLY AND METHOD FOR PERFORMING IN-SITU ENDPOINT DETECTION WHEN BACKSIDE MILLING SILICON BASED DEVICES

CROSS REFERENCE TO RELATED APPLICATION

This application claims benefit to U.S. Provisional Application No. 62/851,777, titled "Assembly and Method for Performing In-Situ Endpoint Detection When Backside Milling Silicon Based Devices" and filed May 23, 2019. The entire content of this application is incorporated herein by reference.

TECHNICAL FIELD

The present invention relates to failure analysis of a semiconductor, field effect transistor based device. More specifically, the invention is directed to automatically determining the endpoint of a milling process without having to remove the silicon based device from a milling machine during a failure analysis.

BACKGROUND

In semiconductor manufacturing, integrated circuit devices are typically built on a substrate. The substrate is preferably made of silicon. Logical circuit components are typically formed within a semiconductor device and are connected through conductive paths in the substrate in an integrated manner thus forming a semiconductor device commonly called an integrated circuit. These components and conductive paths extend different depths into the substrate and the entire assembly is encapsulated in resin or ceramic which serves to protect the device. The substrate varies in thickness depending on processing and from device to device. Substrates formed with different processes can vary by 10s to 100s of microns while the variation in thickness from device to device is usually on the order of 10s to 100s of nanometers. Manufacturers of semiconductor devices will conduct a failure analysis on the semiconductor devices to determine where faults in the devices are located so the devices can be redesigned to avoid the faults. In semiconductor failure analysis, a large amount of the bulk silicon is removed from the device on which a circuit is fabricated to support advanced failure analysis methods, such as optical imaging and optical probing. Such methods simply will not work without removal of enough of the silicon. In addition, Focused Ion Beam and Scanning Electron Microscopy both require some amount of backside thinning before use. The removal process is often conducted on a mill. In each case the milling process must be stopped at a so-called "endpoint" when enough silicon has been removed to reveal an underlying circuit. The endpoint is simply a pre-defined "stop point" determined based on a combination of the survivability of the circuit and the mill being used. This endpoint of the milling process must be determined to avoid the mill damaging the underlying circuit. Therefore, during removal of the bulk silicon, the milling process must be periodically paused and the device must be removed so that the remaining silicon thickness can be measured to determine if more silicon should be removed or the milling should be stopped.

Figure 8:
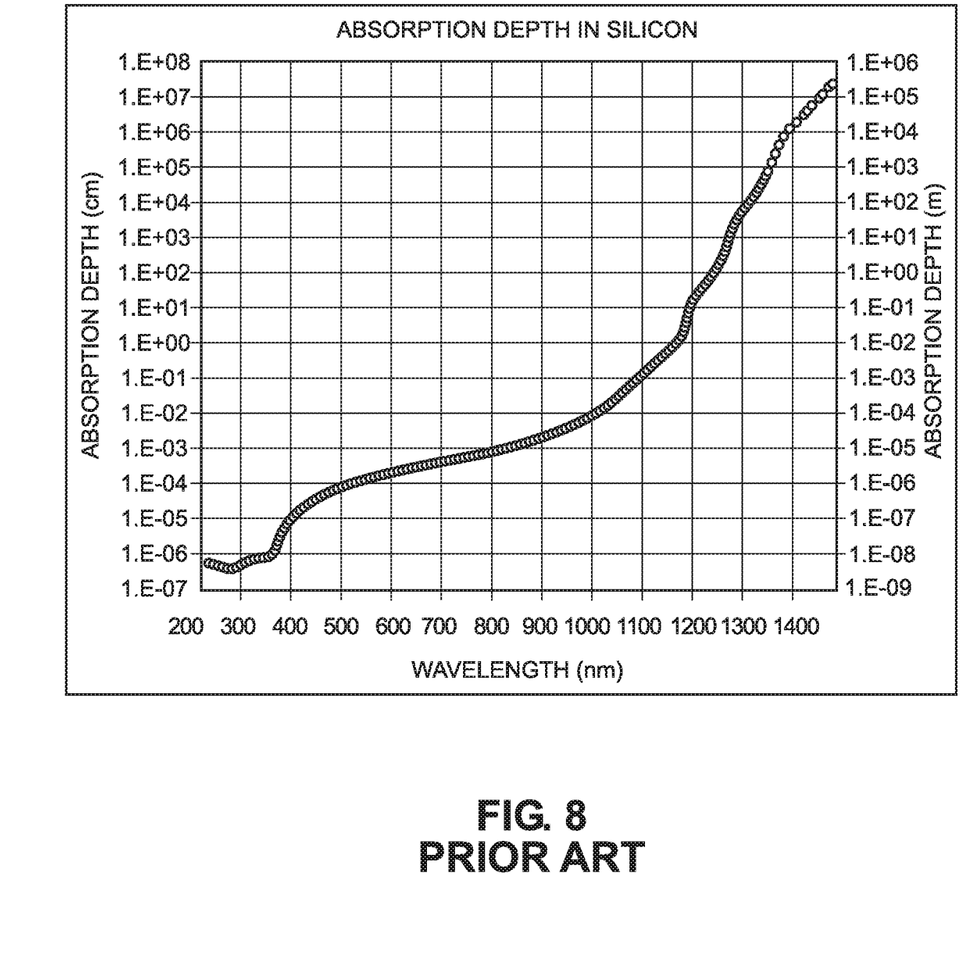
FIG. 8 is a prior art graph showing light absorption depths of silicon at various wavelengths of light.

In optical imaging, as with other analysis techniques, silicon must be removed from the semiconductor device for the imaging to function properly, since the silicon interferes with the imaging. In optical imaging, an interrogating beam is used to measure characteristics of the silicon device in an area of interest within the silicon device. A wavelength of the interrogating beam plays two critical roles in these advanced interrogation systems. First, the wavelength defines the minimum size of an addressable feature that can be detected. In this case the resolvable feature is the smallest portion (also referred to as a "node") of the circuit embedded in the silicon substrate that is being studied. This size is generally governed by the diffraction limit which states that there is a minimum resolvable feature size "D" to any optical system defined as:

$$D = \frac{\lambda}{2 \cdot NA}$$

where lambda is the wavelength of the interrogating beam and "NA" is the numerical aperture of the lens. Second, the wavelength sets the depth the beam can penetrate the silicon. The depth is the distance from the milled surface of the silicon substrate to the circuit in the semiconductor device. The material transparency or absorption of silicon changes based on the wavelength of the light in the interrogating beam. Silicon has an absorption spectrum that is well characterized for wavelengths from the UV through IR spectrums. The absorption depth of varying wavelengths of light can be seen in FIG. 8. At 1319 nm, silicon is almost transparent whereas in the ultraviolet range of wavelengths, 10 nm to 400 nm, silicon is almost completely opaque. Known optical imaging techniques increasingly employ light having a wavelength near the ultraviolet range to resolve smaller features. These two conflicting factors cause a tradeoff between absorption and feature resolvability. Advanced lens systems (solid immersion lenses, etc.) have been developed to increase the numerical aperture as high as 3.3 (unitless), decreasing the diffraction limit. There are physical limitations (geometry and materials) to further increasing the numerical aperture. Therefore, the numerical aperture in lenses is not expected to increase appreciably in the foreseeable future. Due to these factors, at 1319 nm, even using these high numerical aperture lenses results in a resolvable feature size significantly larger than circuit features in the most recently developed devices in the most advanced node size devices (sub-100-nm node size). Therefore, it is desirable to remove as much silicon as possible from a semiconductor device when under test, without destroying the circuits being analyzed.

The problem of absorption is also an issue when using energetic imaging techniques such as electron microscopy and scanning electron microscopy. Silicon only becomes transparent to electrons when there is under (roughly) 5 microns of remaining backside silicon thickness between the milled surface and the circuit being analyzed. Even at this thickness, the transmission of secondary electrons through the silicon drastically reduces the ability of a scanning electron microscope to perform high resolution through silicon imaging and, once again, a small backside silicon thickness is required.

As can be seen from the above discussion, the backside silicon thickness is a fundamental barrier in optical probing. By either removing or reducing the backside silicon thickness, many optical probing techniques regain their viability in integrated circuit failure analysis. The required thickness removal varies by the wavelength desired and the power of the interrogating optical system. However, for many of these techniques it is essential that the device remain operable and the circuit be unaltered. To address the problem of too much bulk backside silicon on integrated circuits, many commercial solutions have been developed to remove the backside silicon through mechanical or chemical milling. Each technique has a trade-off when compared to the other. Mechanical milling is typically less selective and more difficult to control but is far more rapid. Chemical processing is slow, non-uniform, and can sometimes unintentionally affect other systems of the device such as occluding the silicon, damaging an interposer between an integrated circuit die and the metal contacts or corroding the metal contacts themselves. Because of these factors the industry tends to favor mechanical milling over chemical removal of silicon.

Figure 9:
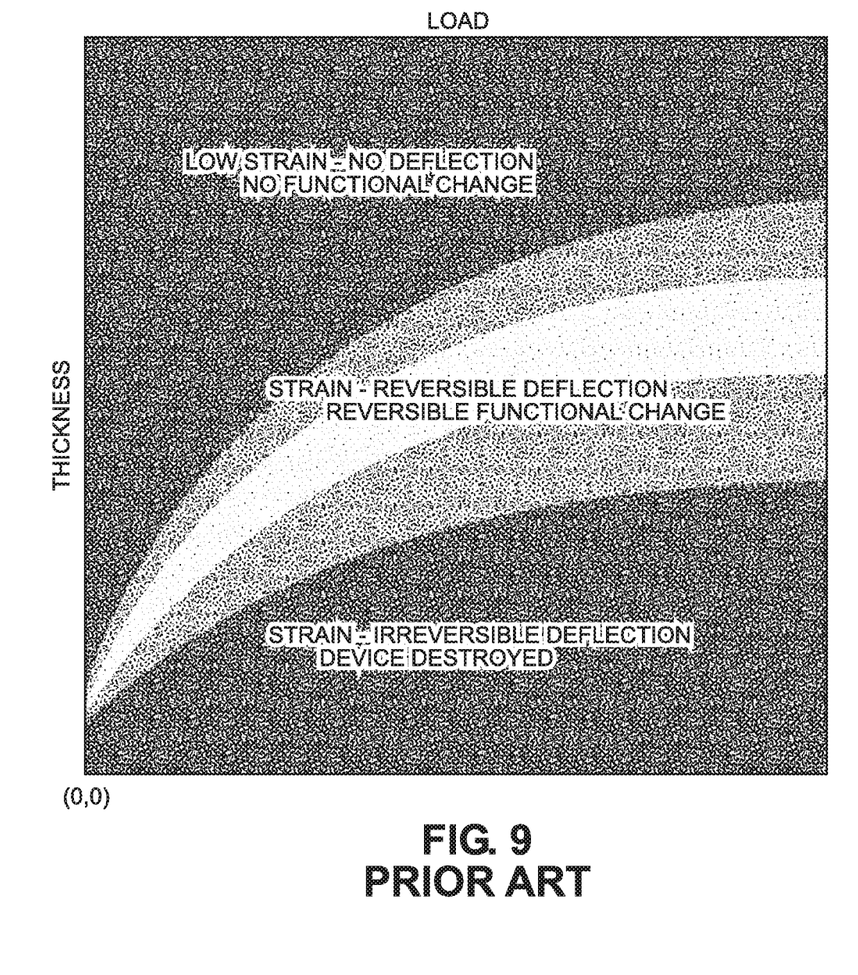
FIG. 9 is a prior art model of a load versus strain at various thicknesses of a semiconductor device.

There are several products on the market designed to mechanically remove backside silicon. The ASAP-1, that is produced in various forms by UltraTec, is a budget backside mill which is capable of gross removal of material. The ASAP-1 is an exclusive end mill with 3 axes (x, y, z milling) which means that it is only capable of applying downward, relatively constant force. The X-Mill, produced by Allied Hightech Inc., is a combination end and edge mill. The X-Mill uses both force feedback and dead reckoning methods to determine endpoints for the milling process. These methods are done in a discrete step fashion by measuring the device thickness on a measurement system, moving the milling head, milling the backside silicon, moving the device to the measurement system, and measuring again. This method provides better accuracy by providing an updated starting point before each milling cycle. However, the remaining silicon thickness does not indicate if the device is still functioning. Also, all of these tools, at some stage in their workflow, require a normal force to be applied to the backside silicon which can compromise device integrity. A simple model of the load/strain relationship is shown in FIG. 9 showing how strain can suddenly change resulting in damage to the device.

What all these devices lack is an in-situ endpoint detection system. Each tool has an algorithm for attempting to mill as close as possible to the milling endpoint desired. However, for each new semiconductor device there is a process of adjusting the mill to the new semiconductor device, using surrogate stand-in devices, to reduce risk of destroying the new device. Devices are regularly destroyed during this process either due to overmilling (i.e. milling through the circuit) or due to the normal force applied to the thinned backside silicon. Even after risk reduction is performed, backside milling techniques represent a high risk to the sample device of interest. Because of this risk, enormous efforts are made to keep backside milling out of the failure analysis process until all other options have been exhausted, even in situations in which backside techniques are likely to be the most effective. After the decision to use backside milling is made, valuable data is still at high risk for loss due to device destruction. Therefore, there exists a need in the art for a method for performing in-situ endpoint detection when backside milling silicon based semiconductor devices.

SUMMARY

As noted above, the ever decreasing size of the smallest feature of an integrated circuit is requiring advanced methods of failure analysis which require the removal of backside silicon from the integrated circuits being tested to enable imaging and interrogation of the field effect transistor layers of the integrated circuit. To reduce risks associated with backside milling of a semiconductor device, the present invention provides an in-situ device function monitoring tool and method for detecting the endpoint of a milling operation. The method uses the piezoelectric mechanism of field effect transistors to actively monitor the power draw of an integrated circuit as the backside silicon is milled. When the downward pressure of the micromill applies strain to the silicon substrate, the electron mobility of the field effect transistors is changed. This property results in a detectable change in the power draw of the device preceding permanent device deformation and associated damage. In one embodiment, an automated feedback system is embodied in a controller for a micromilling machine is used to detect changes associated with strain in the field effect transistors in the semiconductor device being milled and reduce or stop the force of milling when the endpoint of milling is reached before the semiconductor is destroyed.

An assembly is used to monitor the in-situ strain signals through power analysis while a device under test, such as an integrated circuit in a silicon based semiconductor device, is undergoing backside milling. The assembly monitors a semiconductor device under test, including a mill configured to mill the device, a sensor configured to measure an electrical characteristic of the device, and a computer configured to determine the amount of strain in the device from the electrical characteristic when the mill is milling the device and detects whether or not the device is still functioning. The computer can characterize the thickness of the backside silicon and then indirectly determine the thickness of the remaining backside silicon layer within the device. The mill is preferably a micromill including a support for the semiconductor device that moves in both X and Y directions of a milling surface, a feed motor which moves the support in a Z direction normal to the milling surface and a sensor for determining an amount of force applied to the device. The computer is further configured to control the mill when the device is undergoing milling. Preferably, the micromill is configured to support a socket holding the device. The socket immobilizes the device with respect to the micromill and allows access to a backside or frontside of the device. The micromill employs milling fluid and the socket prevents contamination of the electrical contacts of the device by the milling fluid. The assembly also has a signal generator configured to send a signal to the device and produce the measured electrical characteristic. The signal generator and an oscilloscope are connected to the socket when the socket is placed in the micromill or to lead wires connected to the device. The signal generator is preferably configured to apply a clock or a power waveform to the device. Alternatively, the device is soldered to a printed circuit board which is coated with a material providing chemical and electrical passivation. The sensor may be the oscilloscope or, alternatively, is a current or a voltage sensor connected to a digital to analog converter. The sensor could also be an RF sensor.

In use, the assembly mills the semiconductor device in the mill while measuring an electrical characteristic of the device with a sensor during milling and both determines the amount of strain in the device from the electrical characteristic, and detects an endpoint when the functionality of the device is reversibly altered. Preferably thickness can be characterized in multiple runs but this is not the primary function of the device. This results in a method of in-situ monitoring of the power draw of an integrated circuit which is correlated to the strain, under load, of the integrated circuit.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments in connection with the accompanying drawings.

DESCRIPTION OF THE PREFERRED EMBODIMENTS

The following detailed description should be read with reference to the drawings in which similar elements in different drawings are numbered the same. The detailed description and the drawings, which are not necessarily to scale, depict illustrative embodiments and are not intended to limit the scope of the disclosure. The illustrative embodiments depicted are intended only as exemplary. Selected features of any illustrative embodiment may be incorporated into an additional embodiment unless clearly stated to the contrary. While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

As used in this specification and the appended claims, the singular forms "a", "an" and "the" include plural referents unless the content clearly dictates otherwise. As used in this specification and the appended claims, the term "or" is generally employed in its sense including "and/or" unless the content clearly dictates otherwise.

In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

As used throughout, any ranges disclosed herein are used as shorthand for describing each and every value that is within the range. Any value within the range can be selected as the terminus of the range.

Figure 1A:
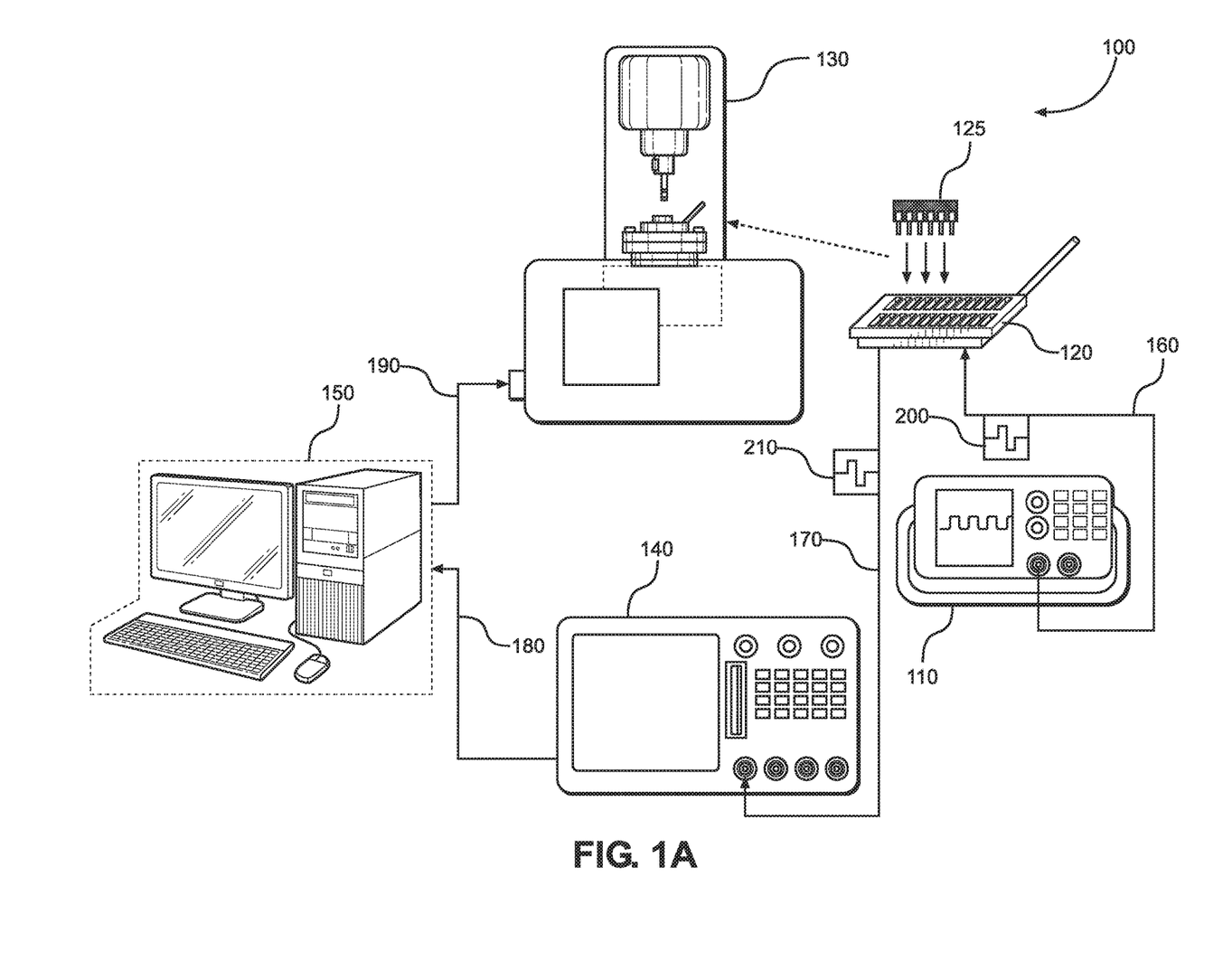
FIG. 1A shows a schematic view of an overall assembly for milling semiconductor devices in accordance with a preferred embodiment of the invention. The assembly is shown with a signal generator, a micromill with a socket, an oscilloscope and a data analysis system with a trigger connection to the micromill.

As best seen in FIG. 1A, an assembly 100 is comprised of a signal generator 110, a socket 120 configured to receive a semiconductor device 125, which may include an integrated circuit, a mill or micromill 130, an electrical signal recording device such as an oscilloscope 140 and a data analysis computer 150. Preferably micromill 130 includes a pressure-based grinding system. Semiconductor device 125 is connected to oscilloscope 140 and signal generator 110 via socket 120. More specifically, a first communication line 160 is provided from signal generator 110 to socket 120 and a second communication line 170 is provided from oscilloscope 140 to socket 120. Oscilloscope 140 is also connected to data analysis computer 150 through a third communication line 180. Data analysis computer 150 can interface via a trigger, represented by line 190 with micromill 130.

Socket 120 may be any socket which allows for temporary placement and electrical connection to signal generator 110 and oscilloscope 140. Preferably, socket 120 immobilizes semiconductor device 125 with respect to micromill 130 and prevents contamination of electrical contacts by milling fluid. Socket 120 may be semi-permanent via solder or conductive attachment. Socket 120 may allow back side access or front side access to semiconductor device 125. In some embodiments semiconductor device 125 is soldered or otherwise permanently wired to lead wires represented by communication line 170 which are connected to oscilloscope 140 and signal generator 110. In these cases, socket 120 is not needed. In some embodiments, socket 120 will be replaced by a printed circuit board (not shown) to which semiconductor device 125 is soldered. Preferably, the printed circuit board is coated with a material after soldering to provide chemical and electrical passivation. Parylene, PDMS, or another common encapsulates are used for this purpose.

Signal generator 110 may be any clock-generating device that can be used to apply a clock or power waveform 200 to semiconductor device 125 either directly or through a specified socket 120. Signal generator 110 could be as simple as a single board microcontroller (i.e. Arduino), FPGA, development board, single board computer, or complex as a professional-grade signal generator. One or more signals 200 are applied to semiconductor device 125. In a most preferred embodiment, a single signal is sent to a clock of semiconductor device 125 causing power draw signal 210 which is measured by oscilloscope 140.

Figure 1B:
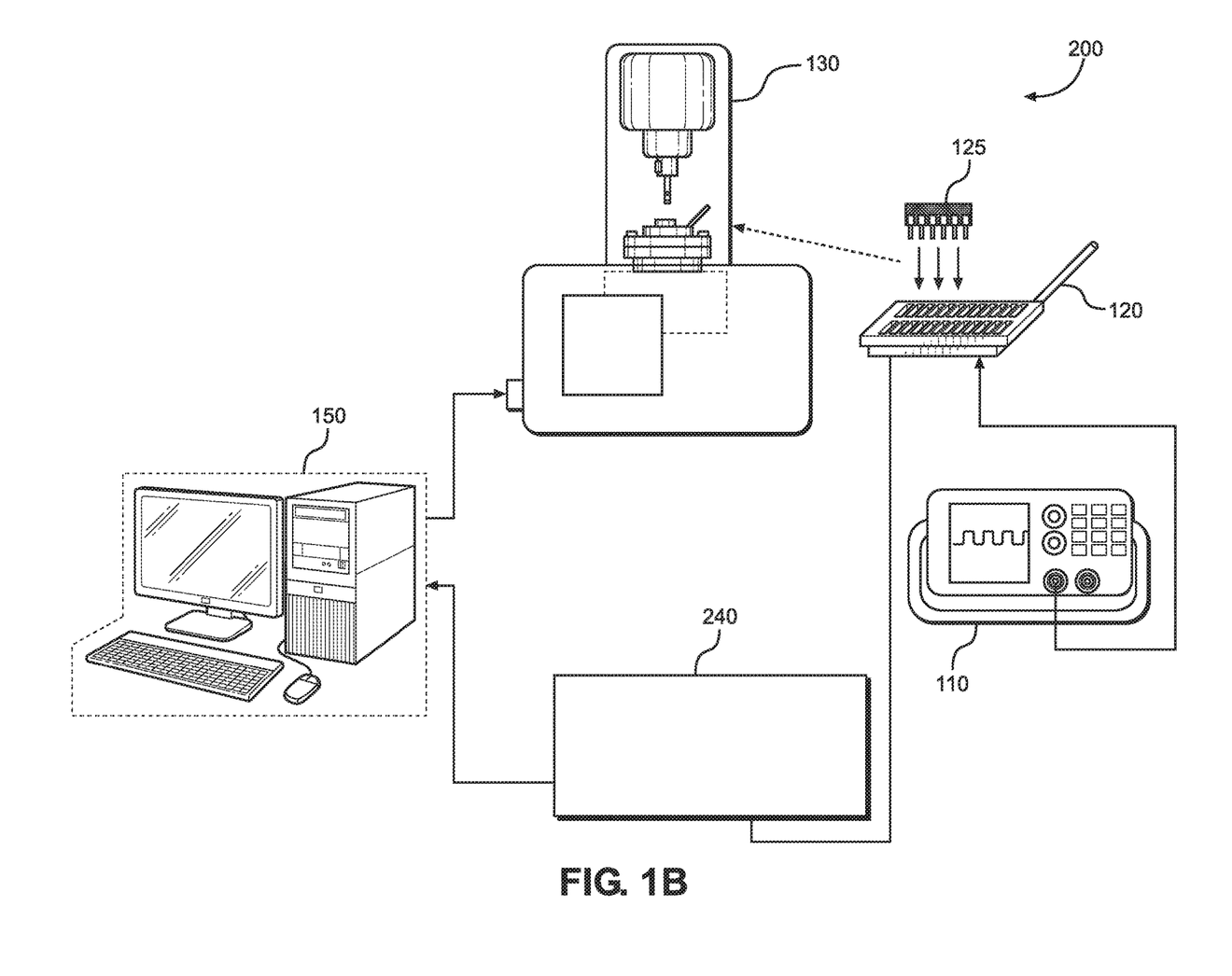
FIG. 1B shows a schematic view of an assembly similar to the assembly of FIG. 1A wherein the oscilloscope has been replaced with a sensor in accordance with another preferred embodiment of the invention.

Oscilloscope 140 may be replaced with any electrical signal recording device such as a side-channel or secondary-effects measurement device. As milling occurs, semiconductor device 125 will continue to produce undisturbed primary effects; indeed, if primary effects are disturbed, milling has caused device failure and sample semiconductor device 125 is no longer usable. As shown in FIG. 1B, oscilloscope 140 has been replaced by a box 240 representing a number of secondary effect measurement devices which may be used instead of oscilloscope 140. For example, a current sensor whose output is digitized via a high speed analog to digital converter could be used. Alternatively, a voltage sensor could be used in place of a current sensor. A thermal sensor could also be employed. Finally, an RF antenna and signal chain could be used to look for variations in RF energy related to strain on the die in semiconductor device 125. Data analysis computer 150 may be any PC or miniature computer; standalone signal analyzer; or signal processing unit built-in to the oscilloscope or any other signal measurement device.

Figure 1C:
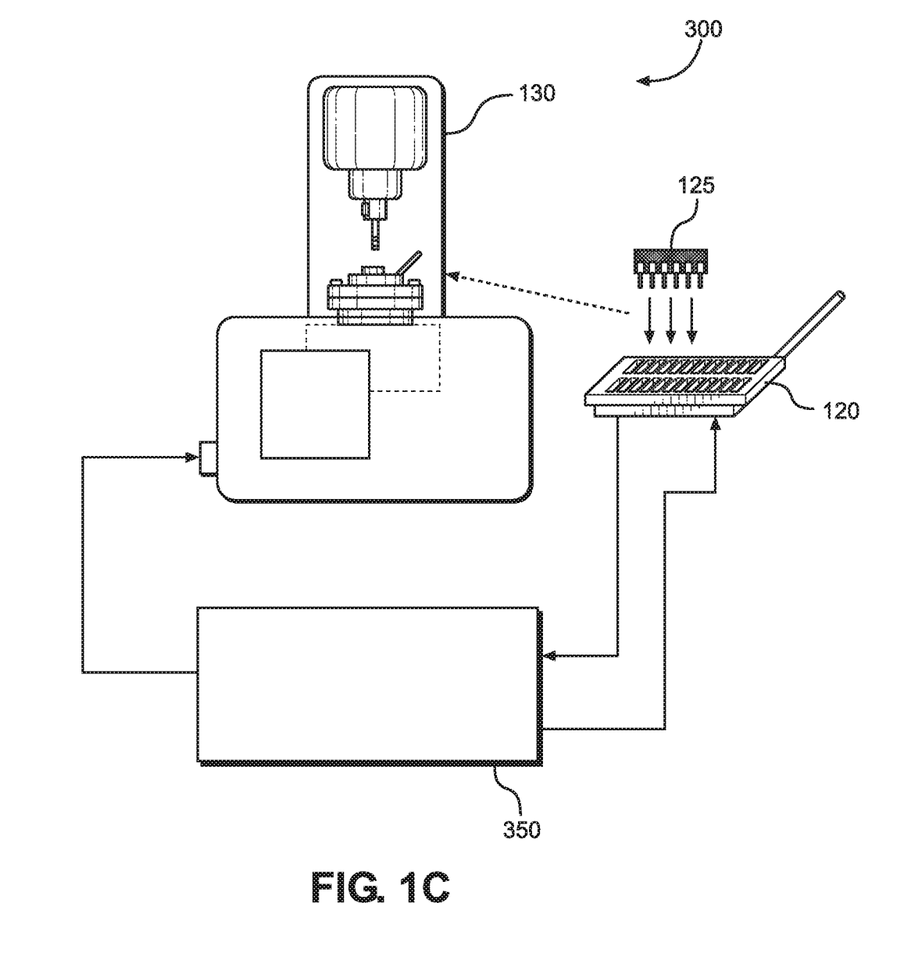
FIG. 1C shows a schematic view of an assembly similar to the assembly of FIG. 1A wherein the signal generator, the oscilloscope and the data analysis system have been combined into one unit.
Figure 2:
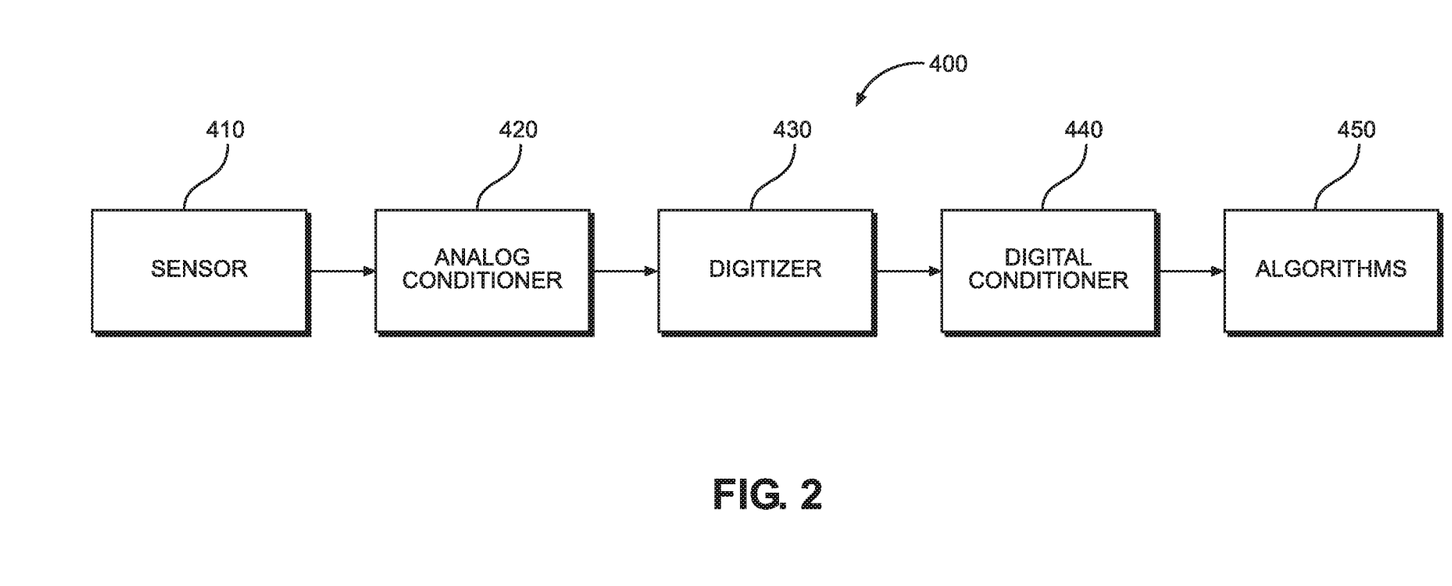
FIG. 2 shows a flow of information between several components of the data analytics device.

In some embodiments, as represented by box 350 shown in FIG. 1C, the functions provided by signal generator 110, oscilloscope 140, and data analysis computer 150 may be implemented in the same controller 350. Controller 350 may take many forms including a field-programmable gate array, a microprocessor development board including a printed circuit board containing a microprocessor and minimal support logic, a personal computer, or a controller integrated within the micromill electronics. Further details of these components are found in U.S. Pat. No. 10,054,624, incorporated herein by reference. Regardless of whether the computer is one separate unit or combined with other units, the overall arrangement will preferably follow the logic shown in FIG. 2 Namely a sensor 410 measures power draw from semiconductor device 125. An analog conditioner 420 receives signal 200 as an analog signal power versus time. Digitizer 430 and digital conditioner 440 segments signal 200 to produce a digital vector representing the signal which is then processed by various machine learning algorithms 450 to determine the second order effects on the power draw and how the second order effects relate to strain in semiconductor device 125. Algorithms 450 can then determine when to send trigger signal 180 to micromill 130 to prevent damage to semiconductor device 125. Dependent on the desired impact, trigger 190 will act differently on micromill 130. In some configurations, trigger 190 will increase or reduce applied pressure, increase or decrease milling bit rotational speed, increase or decrease feed velocity in the horizontal plane, increase or decrease feed velocity in the vertical dimension, increase or decrease stage angle, increase or decrease spindle/collet/milling bit angle, start or stop milling, turn on and off the mill or any combination of the above specified actions.

Figure 3:
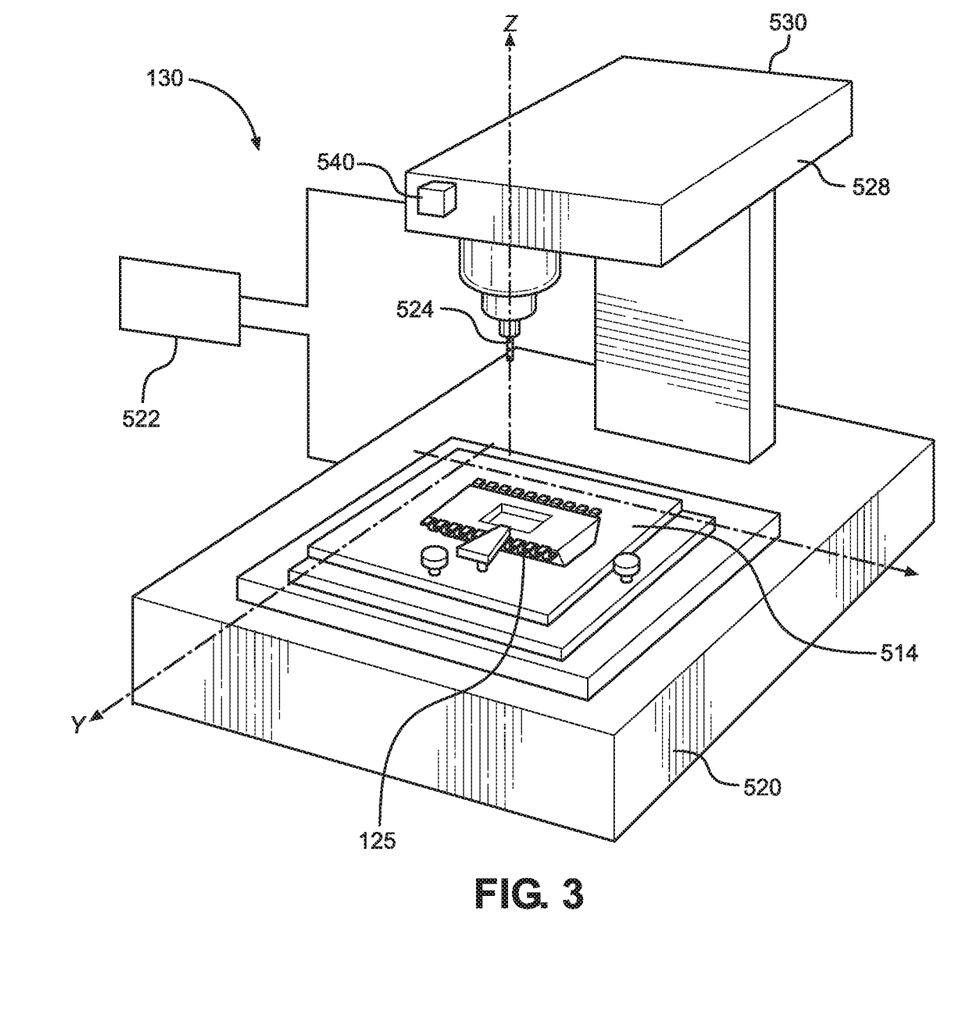
FIG. 3 shows a micromill holding a semiconductor device.

FIG. 3 is a schematic representation of the micromill 130 which includes a tilt table 514 for supporting and oscillating supported semiconductor device 125 in the X and Y directions. Two drive motors are disposed in a base element 520 serve to oscillate table 514 as is well known in the art. Both the speed and the amplitude of the oscillations in the X and Y directions are independently adjustable via controller 522. A tool 524 is rotated at an adjustable speed by an element 528 which is movable in the Z direction. The speed of rotation is adjustable via input from controller 522. A precision Z motor 530 controls the feed velocity normal to the milling surface. Micromill 130 uses a pressure sensor 540 to determine force which is applying to spinning tool 524. This method of contact is known as end milling, as the end of the milling tool 524 removes the material. This pressure ranges from 0-1000 g of force. A similar mill is described in U.S. Pat. No. 6,620,369, incorporated herein by reference. Alternative embodiments of the micromill include additional milling axes, an edge mill (as opposed to an end mill), a mill employing Laser Milling, Laser Assisted Chemical Etching, or Focused or broad ion beam milling.

Figure 4:
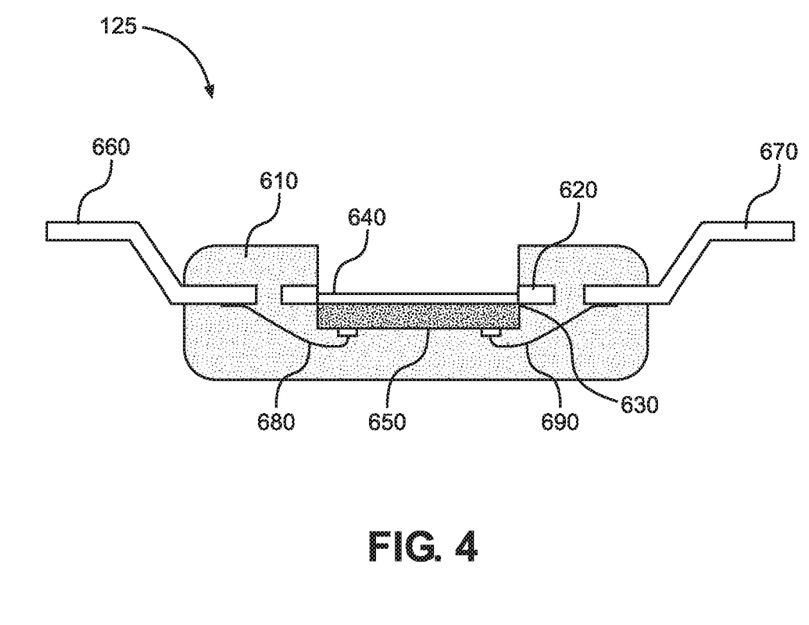
FIG. 4 shows a cross section of a semiconductor device.

FIG. 4 shows a cross section of semiconductor device 125 with a portion of epoxy layer 610 completely removed. Also, a portion of silicon layer 620 is removed leaving a remaining thickness 630 between a milling surface 640 and a die or circuit 650. Circuit 650 is connected to a power contact or pin 660 and a ground contact or pin 670 by conductors 680 and 690 respectively.

Figure 5A:
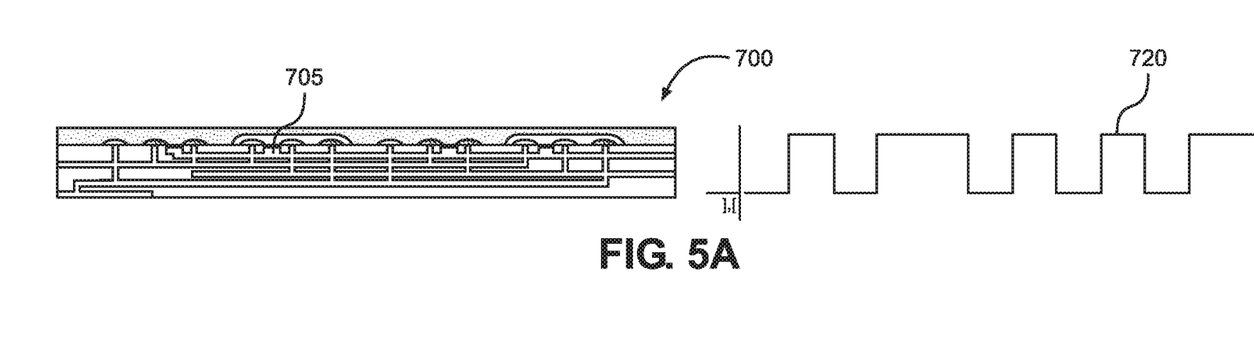
FIGS. 5A, 5B and 5C show a semiconductor device responding to different levels of applied force.
Figure 5B:
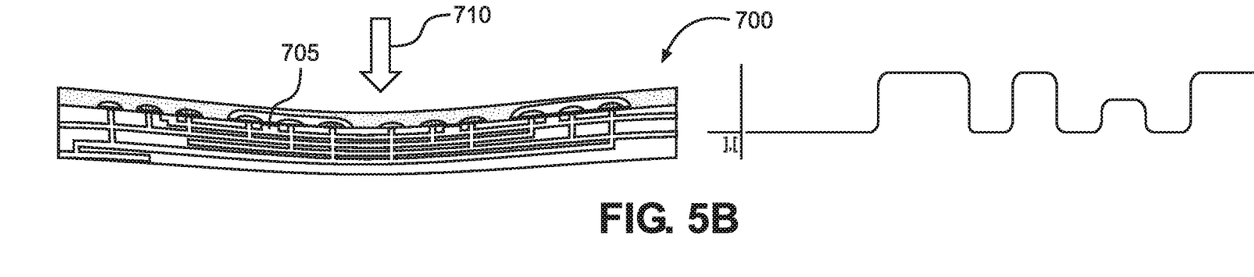
Figure 5C:
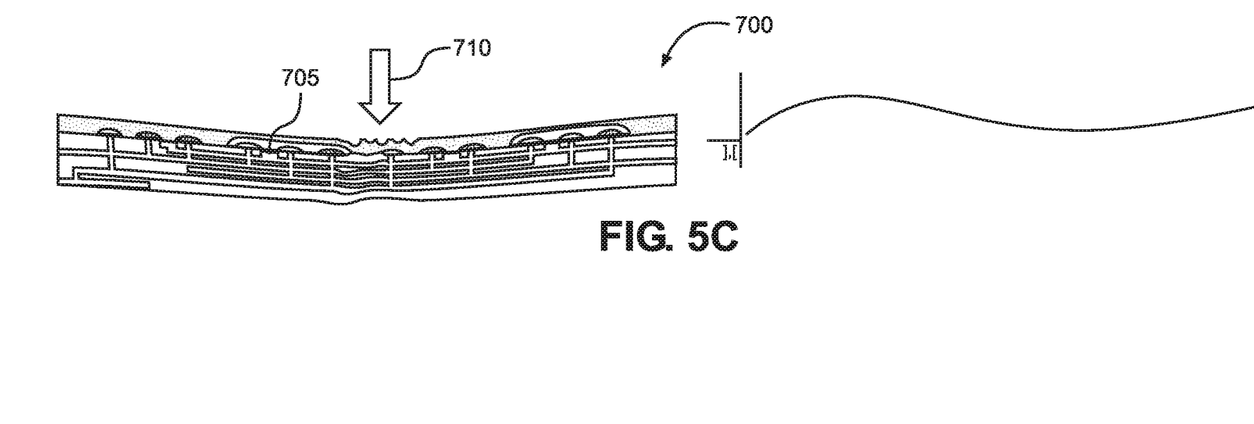

Assembly 100 employs the inherent nature of the semiconductor materials to detect damaging strain in a semiconductor device 700 that includes an integrated circuit 705. As shown in FIGS. 5A-5C there is shown circuit of a semiconductor device 700 under the application of a force shown by an arrow 710. In FIG. 5A no force is applied and an input signal to semiconductor device 700 is faithfully produced as an output signal 720. In FIG. 5B as force 710 is applied the behavior of circuit 705 begins to change. If the pressure is reduced in response to increasing strain semiconductor device 700 will return to normal operation shown in FIG. 5A. If the pressure is not reduced in response to increasing strain, thinning of the silicon by milling will result in device 700 breaking as seen in FIG. 5C. The large deformation cause collisions between metal layers in circuit 705, resulting in shorts and therefore large increases in current draw.

Figure 6:
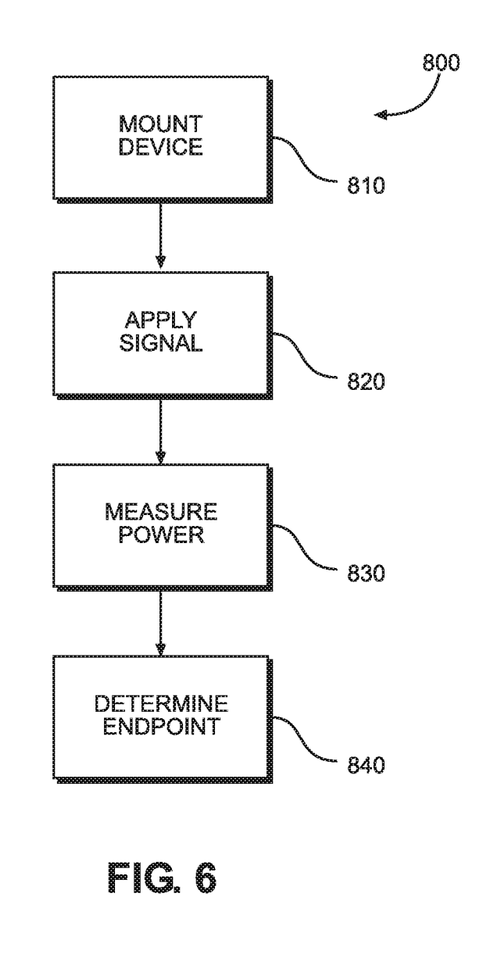
FIG. 6 is a flow chart of a milling process.

As shown in FIG. 6, a method 800 of in-situ monitoring of a principle component analysis of the power draw of semiconductor device 125 is employed to detect a change in strain. Method 800 is employed to remove backside silicon layer 620 in FIG. 4 from semiconductor device 125 to exposed integrated circuit 650, thus allowing circuit 650 to be analyzed for faults using the optical techniques described above.

Initially, at step 810, semiconductor device 125 mounted on table of micromill 130, as shown in FIG. 3. Semiconductor device 125 may be, for example a PIC16 microcontroller manufactured by the Microchip company having at least a power pin connection 660 and a ground pin connection 670. Next, signal generator 110 and oscilloscope 140 are connected to semiconductor device 125. Preferably, signal generator 110 is connected to power pin connection 660 and oscilloscope 140 is connected to ground pin 670. Next micromill 130 is used to remove protective epoxy layer 610 on semiconductor device 125.

At step 820, micromill 130 is controlled to mill backside silicon layer 620 of semiconductor 125 at the same time, signal generator 110 is adjusted to send a signal to semiconductor device 125. Preferably, a block signal 200 is sent but various different types periodic signal may be employed. Oscilloscope 140 measures a response signal from semiconductor device 125, caused by block signal 200 at ground pin 670. While silicon layer 620 of semiconductor device is being milled, the response signal is continuously measured. Also, a force is applied to semiconductor device 125. As micromill 130 mills through silicon layer 620 and gets closer to the actual circuit or die 650 within semiconductor device 125, the strain on die 650 increases and causes a change in power draw signal 210. The force can come from the milling performed by micromill 130 or be generated internally within semiconductor device 125. The force within die 650 is also caused by the die's heterogeneous structure having two disparate materials bonded together which create stress when cyclically loaded and that in turn creates strain. As the milling process removes more and more silicon, semiconductor device 125 becomes more flexible allowing it to strain more. While not wishing to be bound by theory, it is believed that the change in power draw signal 210 is caused by the change in carrier density in the actual semiconductor junctions that change as a function of strain. The power draw is correlated to the strain, under load, of the integrated circuit. Assembly 100 is used to monitor the in-situ strain signals through power analysis while semiconductor device 125 is undergoing backside milling. A typical integrated circuit 650 in semiconductor device 125 contains many field effect transistors. It is theorized that this measurable change in the power draw, or more precisely the measurable second order effect on the power draw is due to the change in electron mobility of the field effect transistors when strained. Regardless, once micromill 130 reaches the endpoint of the milling process when micromill 130 has removed enough of the silicon covering the die, the milling is stopped. Typically the mill is stopped before the silicon is completely removed otherwise the device will not function.

Next at step 830 a power analysis is performed using machine learning techniques to determine the normal power signature of semiconductor device 125 under minimal strain. Preferably, power draw signal 210 is measured over time when semiconductor device 125 subject to clock signal 200, although numerous other values such as voltage over time or current over time could be measured. Power draw signal 210 may be segmented to convert a measured analog power signal into a set of discrete values that represent the power signal. The segmented signal may be referred to as a feature vector. The feature vector can be transformed into the frequency or a different time independent domain. In one embodiment, each feature vector is transformed with a discrete fourier transform or fast fourier transform. In alternative embodiments, each feature vector may be transformed with a discrete cosine transform, Hilbert transform, real cepstrum, wavelet coefficients, or a hybrid of several different transforms. The dimension of the feature vector can be reduced using essentially any known dimension reduction technique. Preferably, principal component analysis is conducted to reduce dimensionality on the feature vector. Principal component analysis transforms the feature vectors into a space where the greatest variance between samples is in the first dimension, the next greatest variance in the next dimension and so on. By organizing the feature vectors by greatest variance, dimensions where the least variance between samples occurs can be discarded in order to enable comparisons in a lower dimensional space with conventional distance metrics. Although the current embodiment implements principal component analysis, other non-linear analysis techniques may be employed instead such as self organizing maps or other manifold based learning algorithms. In one embodiment, principal component analysis on the feature vector to reduce dimensionality of the feature vector includes organizing the feature vector by variance and discarding dimensions where the variance is below a threshold. In another embodiment, principal component analysis on the feature vector to reduce dimensionality of the feature vector includes organizing the feature vector by variance and discarding all but a predefined number of dimensions that have the highest variance. In addition, a clustering analysis may be conducted of the vectors to increase accuracy of determining the strain in the semiconductor device. Further details of these machine learning techniques are found in U.S. Pat. No. 10,054,624 and U.S. Patent Application Publication No. 2018/0307654, both incorporated herein by reference.

Figure 7:
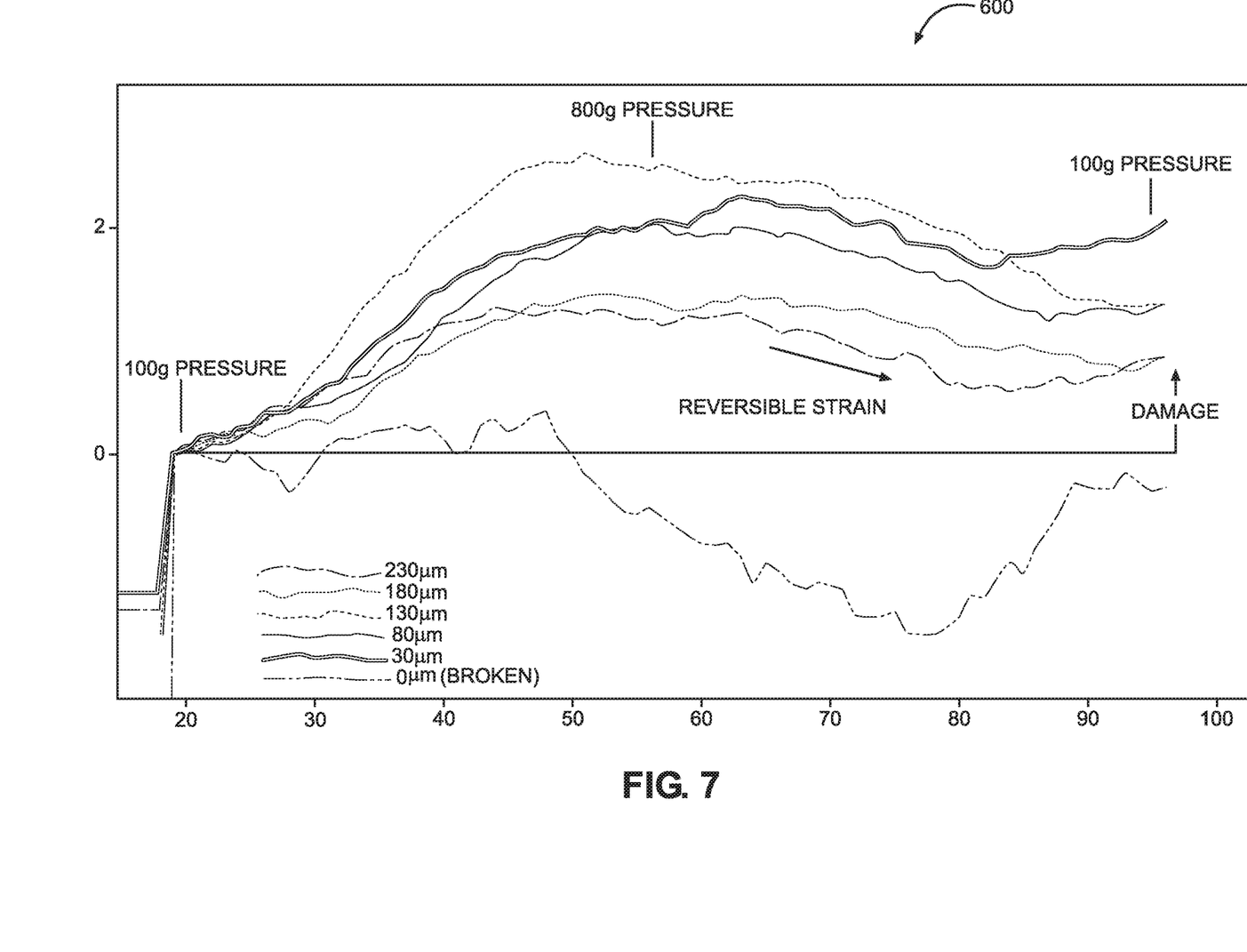
FIG. 7 is a graph showing how a semiconductor responds to different amounts of pressure.

At step 840 the device is monitored while under load. Strain is a function of the cross-sectional profile of homogeneous material. As the thickness goes to zero the strain increases as $t^3$, where t is the thickness and all other factors being equal. By monitoring the change for a sharp increase in the electrical characteristics as a function of strain, the endpoint is detected and the load on the semiconductor device can be reduced when the milling endpoint is detected to avoid irreversible damage. The triggers sent from the computer can thereby be controlled to stop milling when the milling endpoint has been detected. This technique has been demonstrated using a PIC16 microcontroller. In this demonstration, shown in FIG. 7, the device was damaged do to overloading (800 mg) but this is significantly higher than standard milling profiles. As shown in FIG. 7 the strain is reversible after loading. Therefore, the strain can be detected at lower loading values and the milling stopped before irreversible strain is reached.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. For example with the disclosed method a single integrated device may be tested by backside milling method without risking destruction of the device. This contrasts with the prior art method which tended to destroy several identical devices before successfully measuring one of the devices. It will be understood, however, that this disclosure is, in many respects, only illustrative. Changes may be made in details, for example the method looks for significant changes in trend to indicate device stress. This trend identification can be performed through multiple methods. The present embodiment uses principle component analysis on a current waveform. Changes of the principal components over time signify the stress of the sample. Thresholding, rate of change, and other similar algorithms may also be used to indicate critical stress, and thus the stoppage condition. The same algorithm can be applied to other types of sensors. Other algorithm types can include any algorithm that produces trend information from a sample, such as lossy compression, neural networks, curve fitting, and machine learning. The data can be preprocessed in the frequency domain, e.g., fourier transforms, and wavelets, or the time domain, e.g., down sampling, and smoothing filters. Because the nature of internal stresses in modern integrated circuits this method may also be used to determine alterations to a circuit undergoing non-contact-based milling. This may include a focused ion beam, chemical removal, or a laser-based system which does not exert direct force on the backside of the device. The disclosure's scope is, of course, defined in the language in which the appended claims are expressed.

What is claimed is:

1. An assembly for monitoring a semiconductor device during milling comprising:
a socket configured to receive the semiconductor device;
a sensor configured to measure an electrical characteristic of the semiconductor device during milling in a mill, and
a computer configured to determine an amount of strain in the semiconductor device from the electrical characteristic when the mill is milling the semiconductor device and to detect when the milling should stop before a circuit within the semiconductor device is damaged.

2. The assembly of claim 1, wherein the computer is further configured to regulate the mill when the semiconductor device is undergoing milling and determine an amount of silicon left between the milling machine and a circuit located in the semiconductor device based on the electrical characteristic.

3. The assembly of claim 1 wherein the mill is a micromill configured to hold the socket.

4. The assembly of claim 3, wherein the socket immobilizes the semiconductor device with respect to the micromill and allows access to a backside of the semiconductor device and the semiconductor device is an integrated circuit.

5. The assembly of claim 3, wherein the micromill employs milling fluid, the semiconductor device includes electrical contacts and the socket prevents contamination of the electrical contacts by the milling fluid.

6. The assembly of claim 3 further comprising a signal generator configured to send a signal to the semiconductor device and produce the electrical characteristic.

7. The assembly of claim 6, wherein the signal generator is connected to the socket when the socket is placed in the micromill.

8. The assembly of claim 1 further comprising a signal generator configured to send a signal to the semiconductor device and produce the electrical characteristic which is related to a second order effect of a power draw of the silicon device.

9. The assembly of claim 8, wherein the signal generator is configured to apply a clock or a power waveform to the semiconductor device.

10. The assembly of claim 8, wherein the signal generator is connected to the semiconductor device by lead wires.

11. An assembly for monitoring a semiconductor device soldered to a printed circuit board during milling comprising:
a sensor configured to measure an electrical characteristic of the semiconductor device during milling in a mill; and
a computer configured to determine an amount of strain in the semiconductor device from the electrical characteristic when the mill is milling the semiconductor device and to detect when the milling should stop before a circuit within the semiconductor device is damaged.

12. The assembly of claim 1, wherein the sensor is an electrical signal recording device.

13. The assembly of claim 1, wherein the sensor is a current or a voltage sensor connected to a digital to analog converter.

14. The assembly of claim 1, wherein the sensor is an RF sensor.

15. The assembly of claim 1, wherein the mill is a micromill including a support for the semiconductor device that moves in both X and Y directions of a milling surface, a feed motor which moves the support in a Z direction normal to the milling surface and a sensor for determining an amount of force applied to the semiconductor device.

16. A method of milling a semiconductor device soldered to a printed circuit board, the semiconductor device including a circuit, said method comprising:
measuring an electrical characteristic of the semiconductor device with a sensor during milling in a mill;
detecting an amount of strain in the semiconductor device from the electrical characteristic; and
determining when to stop milling based on the amount of strain.

17. The method according to claim 16, wherein the electrical characteristic is an analog measurement of power versus time and further comprising segmenting the analog measurement of power versus time into a vector.

18. The method according to claim 17 further comprising conducting a machine learning technique to the vector to relate a power measurement to strain in the semiconductor device.

19. The method according to claim 18 further comprising determining a thickness of the remaining silicon being milled based on the strain in the semiconductor device and controlling the milling based on the power measurement to stop milling when the thickness of the silicon becomes too thin and before the circuit is damaged and wherein the power measurement is a second order effect on a power draw of the semiconductor device.

* * * * *